United States Patent
Hasumi et al.

(10) Patent No.: US 9,373,299 B2
(45) Date of Patent: Jun. 21, 2016

(54) DISPLAY DEVICE AND METHOD OF FORMING A DISPLAY DEVICE

(71) Applicant: LG DISPLAY CO., LTD., Seoul (KR)

(72) Inventors: Taro Hasumi, Seoul (KR); Jino Lee, Paju-si (KR); Jungchul Kim, Paju-si (KR); Jaehee Park, Gumi-si (KR); Sehwan Na, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 389 days.

(21) Appl. No.: 13/939,361

(22) Filed: Jul. 11, 2013

(65) Prior Publication Data

US 2014/0022230 A1    Jan. 23, 2014

(30) Foreign Application Priority Data

Jul. 23, 2012  (KR) .................. 10-2012-0080055
May 8, 2013   (KR) .................. 10-2013-0051865

(51) Int. Cl.
*G09G 3/36* (2006.01)
*G02F 1/1345* (2006.01)
*H01L 27/32* (2006.01)

(52) U.S. Cl.
CPC .......... *G09G 3/3696* (2013.01); *G02F 1/13452* (2013.01); *H01L 27/3276* (2013.01)

(58) Field of Classification Search
CPC . G09G 3/3685; G09G 3/3688; G09G 3/3692; G09G 3/3696; G02F 1/13452; H01L 27/3276
See application file for complete search history.

(56) References Cited

U.S. PATENT DOCUMENTS

2005/0012454 A1*  1/2005  Yamazaki ........... H01L 27/3276 313/506
2005/0179374 A1*  8/2005  Kwak ................. H01L 27/3276 313/506

(Continued)

FOREIGN PATENT DOCUMENTS

KR    100830981 B1    5/2008

OTHER PUBLICATIONS

Office Action dated Oct. 20, 2014, issued by the Korean Intellectual Property Office in Korean Patent Application No. 10-2013-0051865.

*Primary Examiner* — Tom Sheng
(74) *Attorney, Agent, or Firm* — Morgan, Lewis & Bockius LLP

(57) ABSTRACT

A display device and method of forming a display device are provided. A display device includes: a first auxiliary electrode coupled to a first power voltage supply line; a second auxiliary electrode coupled to a second power voltage supply line with a first link electrode; an active area, comprising: scan lines; data lines; first voltage lines; second voltage lines; and pixels; and a display drive circuit configured to supply data voltages to data links coupled to the data lines, wherein the first auxiliary electrode, the second auxiliary electrode, the first power voltage supply line, the second power voltage supply line, the data links, and the display drive circuit being in a bezel area corresponding to an area outside the active area, the second auxiliary electrode being between the first auxiliary electrode and the active area, the first auxiliary electrode being between the second auxiliary electrode and the display drive circuit.

22 Claims, 11 Drawing Sheets

(56) References Cited

U.S. PATENT DOCUMENTS

| | | | |
|---|---|---|---|
| 2006/0044237 A1* | 3/2006 | Lee | G09G 3/3233 345/82 |
| 2006/0123293 A1* | 6/2006 | Kim | G09G 3/3291 714/724 |
| 2007/0024541 A1* | 2/2007 | Ryu | G09G 3/3233 345/76 |
| 2007/0096135 A1* | 5/2007 | Matsumoto | H01L 27/3276 257/99 |
| 2008/0191603 A1* | 8/2008 | Kubota | H01L 51/5221 313/498 |
| 2008/0252203 A1 | 10/2008 | Lee | |
| 2009/0027366 A1* | 1/2009 | Kim | G09G 3/3685 345/204 |
| 2013/0106817 A1* | 5/2013 | Gang | H01L 27/3276 345/211 |

* cited by examiner

DISPLAY DEVICE AND METHOD OF FORMING A DISPLAY DEVICE

CROSS-REFERENCE TO RELATED APPLICATIONS

This application claims priority under 35 U.S.C. §119(a) to Korean Patent Application No. 10-2012-0080055, filed on Jul. 23, 2012, and Korean Patent Application No. 10-2013-0051865, filed on May 8, 2013, the disclosure of each of which is incorporated by reference in its entirety herein for all purposes.

BACKGROUND

1. Field

The following disclosure relates to a display device and method of forming a display device.

2. Discussion of the Related Art

With the development of an information society, the demand for various types of display devices for displaying an image is increasing. Various flat panel displays such as a liquid crystal display (LCD), a plasma display panel (PDP), and an organic light emitting diode (OLED) display device have been widely used in recent years. Among the flat panel displays, the OLED display device are driven at a low voltage, are thin, and have a wide viewing angle and a quick response speed.

The OLED display device includes a display panel including a plurality of pixels arranged in a matrix form. Gate signals from a scan drive circuit and data voltages from a data drive circuit are supplied to the display panel for driving the pixels. Also, a plurality of power supply voltages are supplied to the display panel. In this case, the data voltages and the power supply voltages are supplied through one side of the display panel. Therefore, data links for transmitting data voltages and power supply lines for transmitting the power supply voltages are formed on the one side of the display panel.

Meanwhile, according to market demand, the display device becomes slimmer, and also design and appearance of the display device becomes more important. Therefore, it is an important factor to decrease a bezel area for making the display device slim and improving design and appearance of the display device. The bezel area refers to a non-display area that surrounds the display panel. However, it is difficult to decrease the bezel area of the side of the display panel through which the data voltages and the power supply voltages are supplied due to data links and power supply lines.

SUMMARY

Embodiments of the present invention relate to a display device and method of forming a display device.

Advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the embodiments, as embodied and broadly described herein, there is provided a display device, including: a first auxiliary electrode coupled to a first power voltage supply line configured to supply a first power voltage, a second auxiliary electrode coupled to a second power voltage supply line configured to supply a second power voltage through a first link electrode, an active area, including: scan lines, data lines crossing over the scan lines, first voltage lines coupled to the first auxiliary electrode, second voltage lines coupled to the second auxiliary electrode, and a plurality of pixels arranged in a matrix form, and a display drive circuit configured to supply data voltages to data links coupled to the data lines, wherein the first auxiliary electrode, the second auxiliary electrode, the first power voltage supply line, the second power voltage supply line, the data links, and the display drive circuit are formed in a bezel area corresponding to an area outside the active area, wherein the second auxiliary electrode is formed between the first auxiliary electrode and the active area, and wherein the first auxiliary electrode is formed between the second auxiliary electrode and the display drive circuit.

In another aspect, there is provided a method of forming a display device, including: forming a first auxiliary electrode coupled to a first power voltage supply line configured to supply a first power voltage, forming a second auxiliary electrode coupled to a second power voltage supply line configured to supply a second power voltage through a first link electrode, forming an active area, including: scan lines, data lines crossing over the scan lines, first voltage lines coupled to the first auxiliary electrode, second voltage lines coupled to the second auxiliary electrode, and a plurality of pixels arranged in a matrix form, forming a display drive circuit configured to supply data voltages to data links coupled to the data lines, forming the first auxiliary electrode, the second auxiliary electrode, the first power voltage supply line, the second power voltage supply line, the data links, and the display drive circuit in a bezel area corresponding to an area outside the active area, forming the second auxiliary electrode between the first auxiliary electrode and the active area, and forming the first auxiliary electrode between the second auxiliary electrode and the display drive circuit.

It is to be understood that both the foregoing general description and the following detailed description are examples and explanatory and are intended to provide further explanation of embodiments of the invention as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Figure 1:
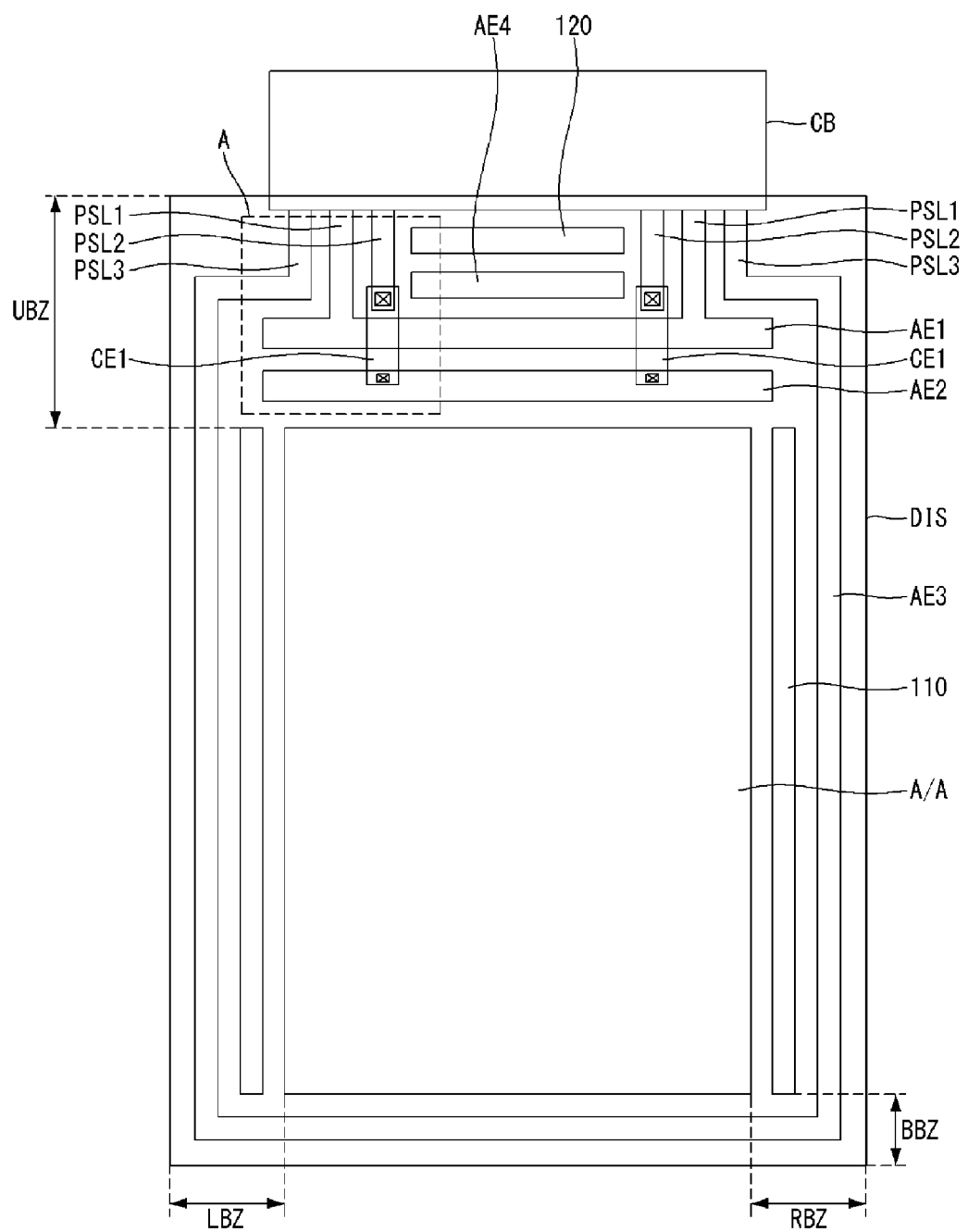
FIG. 1 is a plan of a display panel according to an example embodiment.

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

FIG. 1 is a plan of a display panel according to an example embodiment. The display device according to the example embodiment may be implemented as a flat panel display device, such as a liquid crystal display (LCD), a field emission display (FED), a plasma display panel (PDP), an organic light emitting diode (OLED) display device, and the like. In the following description, the example embodiment describes the OLED display device as an example of the display device. Other kinds of flat panel displays may be used.

Figure 2:
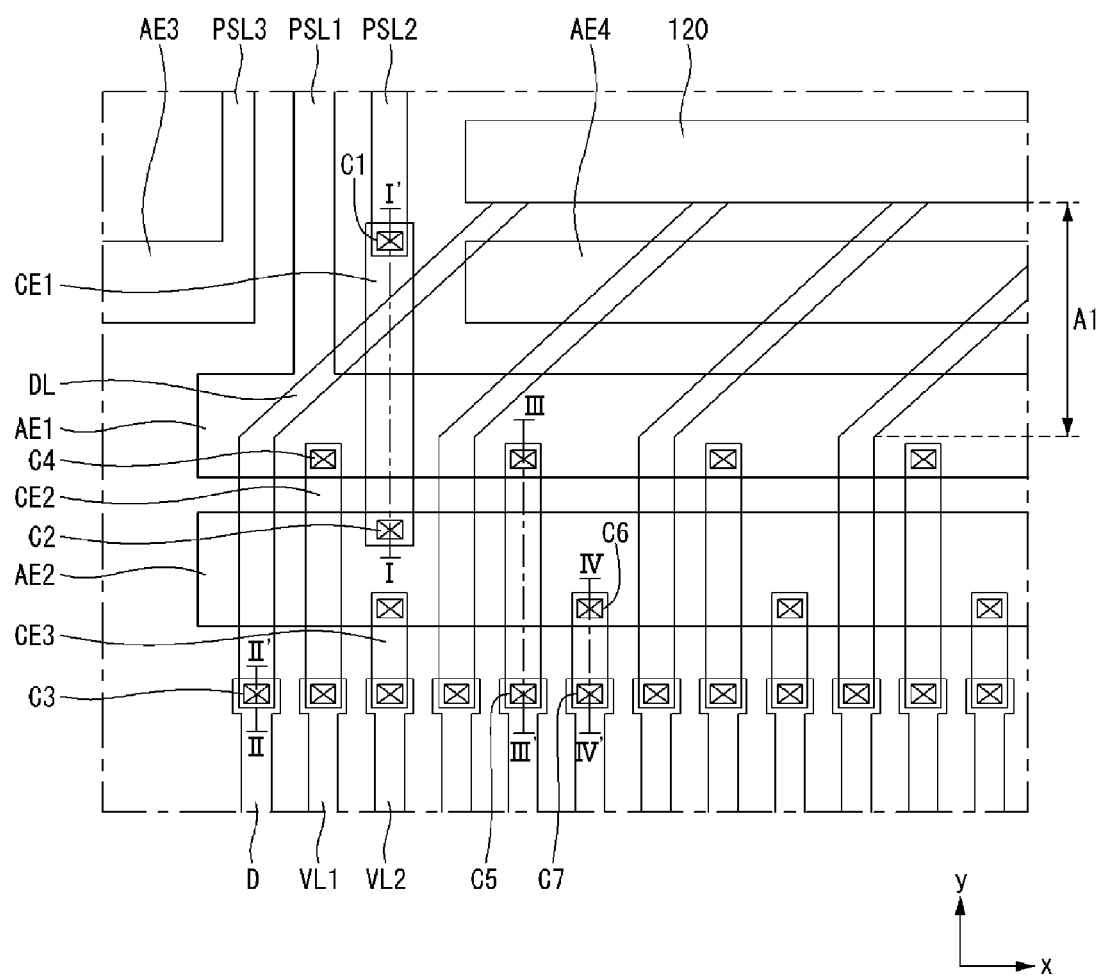
FIG. 2 is an expanded plan of an area "A" in FIG. 1.
Figure 9:
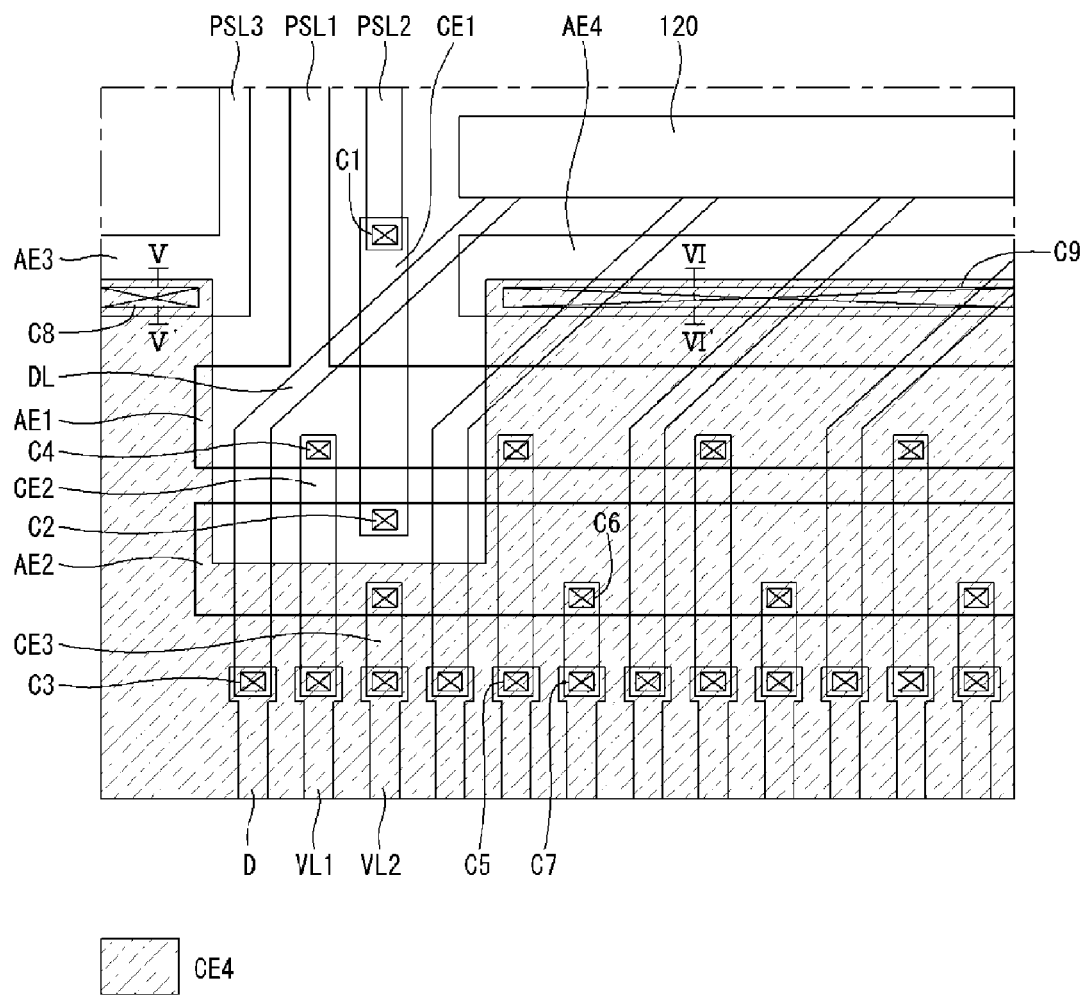
FIG. 9 is an expanded plan including a fourth link electrode in the expanded plan of FIG. 2.
Figure 11:
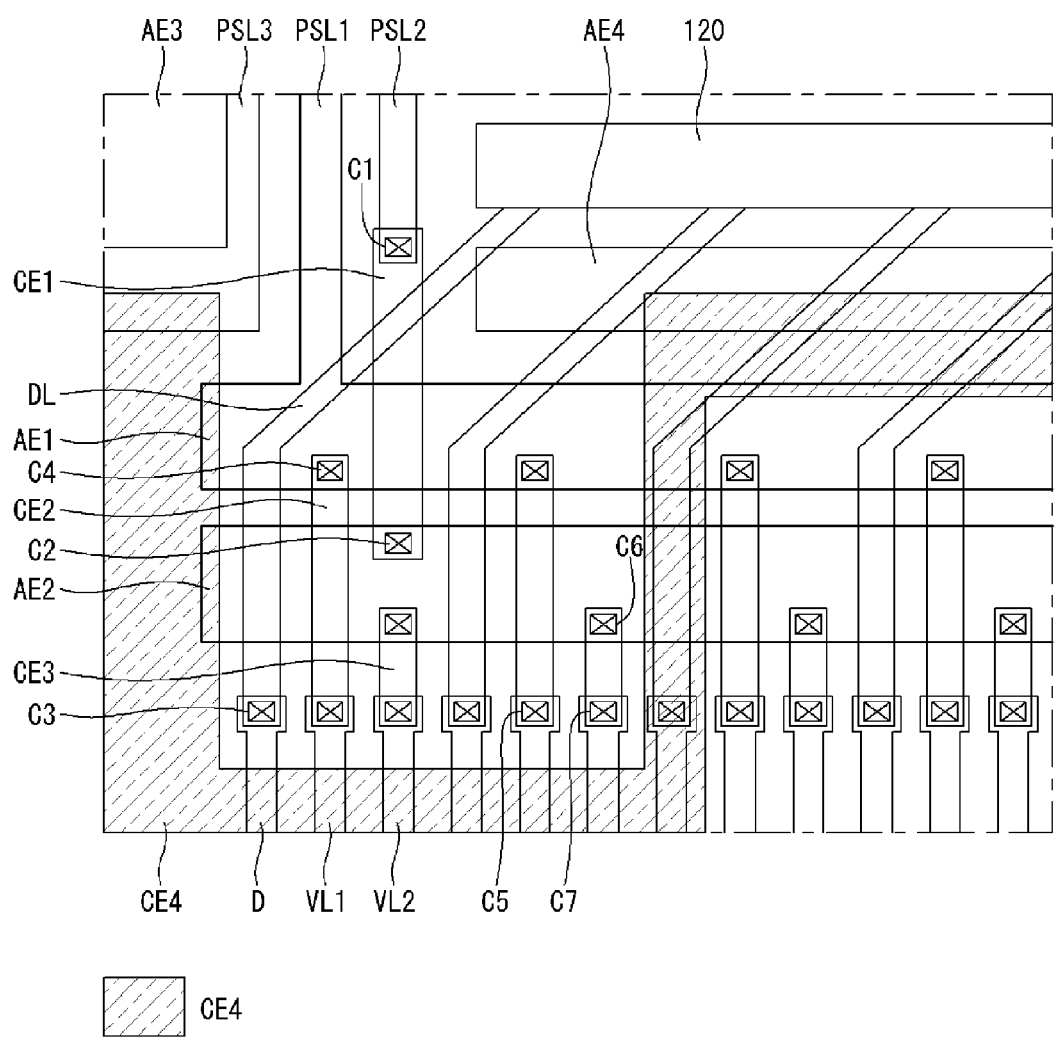
FIG. 11 is another expanded plan including a fourth link electrode in the expanded plan of FIG. 2.

With reference to FIG. 1, the display device according to the example embodiment may include a display panel DIS and a circuit board CB. An active area A/A displaying an image may be formed on the display panel. Scan lines, data lines, first voltage lines and second voltage lines may be formed on the active area A/A. The data lines may cross over the scan lines. The first voltage lines and the second voltage lines may be parallel to the data lines as shown in FIGS. 2, 9, and 11. The active area A/A may include a plurality of pixels arranged in a matrix form on an intersecting area of the data lines and the scan lines. Each of the pixels may include one or more switching TFTs (thin film transistors), a driving TFT, an organic light emitting diode, and one or more capacitors. A data voltage of a data line may be supplied to a pixel through a switching TFT in response to a scan signal of a scan line. Also, the first voltage lines may supply a first power voltage to the pixels and the second voltage lines VL2 may supply the second power voltage to the pixels for driving the pixels. The pixel may emit light by controlling a current that flows into the organic light emitting diode according to the data voltage. The display panel DIS may display the image in the form of a bottom emission, a top emission, and the like.

A "bezel area" refers to an area other than the active area A/A. The bezel area may correspond to a non-display area that does not display the image. A first auxiliary electrode AE1, a second auxiliary electrode AE2, a third auxiliary electrode AE3, a fourth auxiliary electrode AE4, a first power voltage supply line PSL1, a second power voltage supply line PSL2, the data links, and a display drive circuit 120 may be formed in the bezel area.

The first auxiliary electrode AE1, a second auxiliary electrode AE2, a third auxiliary electrode AE3, and a fourth auxiliary electrode AE4 may be formed on the display panel DIS. The first auxiliary electrode AE1 may be coupled to a first power supply line PSL1 supplying a first power voltage. The second auxiliary electrode AE2 may be coupled to a second power supply line PSL2 supplying a second power voltage through a first link electrode CE1. The third auxiliary electrode AE3 may be coupled to a third power supply line PSL3 supplying a third power voltage. The fourth auxiliary electrode AE4 may be coupled to the third auxiliary electrode AE3 through the fourth link electrode CE4 as shown in FIG. 9 or 11.

The first auxiliary electrode AE1, the second auxiliary electrode AE2, and the fourth auxiliary electrode AE4 may be formed between the display drive circuit 120 and the active area A/A. Especially, the first auxiliary electrode AE1 may be formed between the second auxiliary electrode AE2 and the fourth auxiliary electrode AE4. The second auxiliary electrode AE2 may be formed between the first auxiliary electrode AE1 and the active area A/A. The fourth auxiliary electrode AE4 may be formed between the display drive circuit 120 and the first auxiliary electrode AE1. The first auxiliary electrode AE1, the second auxiliary electrode AE2, and the fourth auxiliary electrode AE4 may be parallel to the scan lines. The third auxiliary electrode AE3 may surround the active area A/A except for a side adjacent to the second auxiliary electrode AE2.

The display panel DIS may include a scan drive circuit 110 and the display drive circuit 120 for displaying the image. The scan drive circuit 110 may sequentially supply the scan signals to the scan lines for controlling switching TFTs of the pixels, in response to scan timing control signals from the display driving circuit 120. Meanwhile, signal lines for supplying the scan timing control signals from the display driving circuit 120 to the scan drive circuit 110 are omitted for convenience of description, as they should be understood to one of ordinary skill in the art.

The scan driving circuit 110 may be directly formed on the lower substrate of the display panel DIS through a gate-in-panel (GIP) process as shown in FIG. 1. As an alternative, the gate driving circuit 100 may be mounted on a tape carrier package (TCP) and connected to the scan lines of the display panel DIS through a tape automated bonding (TAB) process.

The display driving circuit 120 may receive digital video data and timing signals from the host system mounted on the circuit board CB. The timing signals may include a vertical synchronization signal, a horizontal synchronization signal, a data enable signal, and a dot clock. The display driving circuit 120 may generate the scan timing control signals for controlling operation timings of the scan drive circuit 110 based on the digital video data and the timing signals. The display driving unit 120 may output the scan timing control signals to the scan drive circuit 110.

Also, the display driving unit 120 may convert the digital video data into analog data voltages and may supply the data voltages to the data lines of the display panel DIS through the data links in synchronization with scan signals. Meanwhile, the display device may further include a multiplexer which may divide a plurality of data voltages supplied through one data link line into a plurality of data lines. In one example, the multiplexer may be formed between the second auxiliary electrode AE2 and the active area A/A as shown in FIG. 2.

The display drive circuit 120 may be directly attached on the lower substrate of the display panel DIS by the chip on glass (COG) process as shown in FIG. 1. As an alternative, the display drive circuit 120 may be mounted on the TCP and connected to the data links and a source printed circuit board (PCB) through the TAB process.

The circuit board CB may include a power voltage source and a host system. The power voltage source may supply first to third power voltages to the display panel DIS. The power voltage source 140 may supply a first power voltage to the first power voltage supply line PSL1, a second power voltage to the second power voltage supply line PSL2, and a third power voltage to the third power voltage supply line PSL3. When the display device according the example embodiment is implemented as the OLED display device, the first power voltage may be a high-potential voltage, the second power voltage may be an initialization voltage, and the third power voltage may be a low-potential voltage. The high-potential voltage may have a higher level than the low-potential voltage. The "initialization voltage" refers to a voltage for initializing each of the pixels every predetermined period in order to drive each of the pixels. The high-potential voltage, the low-potential voltage, and the initialization voltage may be predetermined through a pre-experiment. Also, the power voltage source may supply a gate high voltage and a gate low voltage lower than the gate high voltage to the scan drive circuit 110 for generating the scan signals.

The host system may include a system on chip having a scaler therein and may convert digital video data to a data format having a resolution appropriate for displaying in the display panel DIS. The host system may transmit the digital video data and timing signals to the display drive circuit 120 via an interface such as an LVDS (low voltage differential signaling) interface, a TMDS (transition minimized differential signaling) interface, or the like.

Meanwhile, the bezel area may be divided into an upper bezel area UBZ, a left bezel area LBZ, a right bezel area RBZ, and a bottom bezel area BBZ. The third auxiliary electrode AE3 and the scan drive circuit 110 may be formed in the left bezel area LBZ and the right bezel area RBZ. The third auxiliary electrode AE3 may be formed in the bottom bezel area BBZ. On the other hand, the display drive circuit 120, the first auxiliary electrode AE1, the second auxiliary electrode AE2, and the fourth auxiliary electrode AE4 may be formed in the upper bezel area. Thus, the width of the upper bezel area UBZ may be wider than the width of each of the left bezel area LBZ, the right bezel area RBZ, and the bottom bezel area BBZ.

According to some embodiments, the second power voltage supply line PSL2 may be coupled to the second auxiliary electrode AE2 through the first link electrode CE1. The first link electrode CE1 may be made of a metal pattern different from the second power voltage supply line PSL2, the second auxiliary electrode AE2, and the data links. For example, the data links may be made of a first metal pattern, the first power voltage supply line PSL1, the second power voltage supply line PSL2, the first auxiliary electrode AE1; and the second auxiliary electrode AE2 may be made of a second metal pattern. The first link electrode CE1 may be made of a third metal pattern. Thus, the embodiments may form the first auxiliary electrode AE1 in an area A1 on which the data links are formed obliquely against the data lines.

However, according to the related art, the second power voltage supply line PSL2 is coupled to the second auxiliary electrode AE2 through the first link electrode CE1 which is made of a metal pattern same as the data links. In the related art, the data links and the first link electrode CE1 are made of a first metal pattern, the first power voltage supply line PSL1, the second power voltage supply line PSL2, the first auxiliary electrode AE1, and the second auxiliary electrode AE2 are made of a second metal pattern. Thus, in the related art, the first auxiliary electrode AE1 cannot be formed in the area A1.

Accordingly, embodiments of the present invention may decrease the width of the upper bezel area UBZ against the prior art because a gap between the display drive circuit 120 and the first auxiliary electrode AE1 is decreased a compared to the related art.

As described below, a connection structure of the first to third power voltage supply lines PSL1, PSL2, PSL3, the first to fourth auxiliary electrodes AE1, AE2, AE3, AE4, the data links, the data lines, and the first and second voltage lines for decreasing the upper bezel area UBZ are described with reference to FIG. 2.

Figure 3:
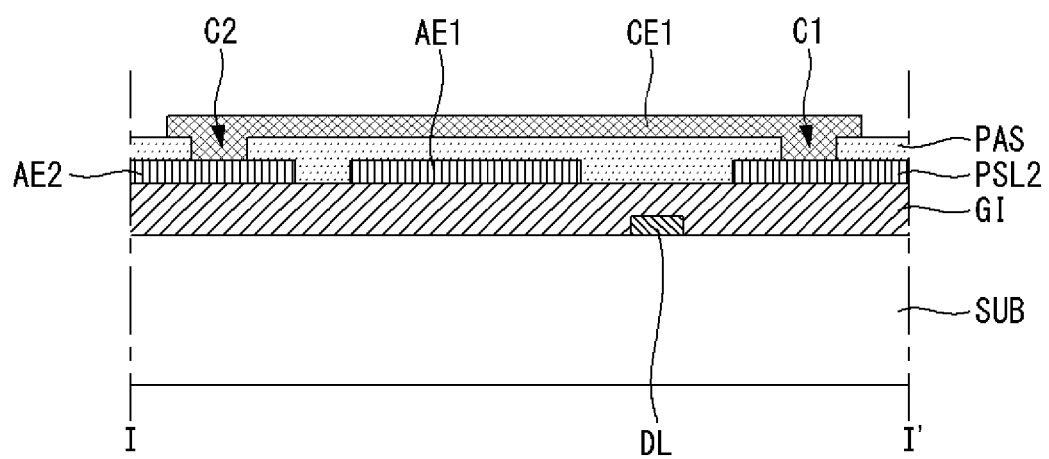
FIG. 3 is a cross-sectional diagram of I-I' in FIG. 2.

FIG. 2 is an expanded plan of an area "A" in FIG. 1. With reference to FIG. 2, the first power supply line PSL1 may be directly coupled to the first auxiliary electrode AE1. The second power supply line PSL2 may be coupled to the second auxiliary AE2 through the first link electrode CE1. For example, the second auxiliary electrode AE2 may be coupled to the first link electrode CE1 through a first contact hole C1 and the second power voltage supply line PSL2 may be coupled to the first link electrode CE1 through a second contact hole C2 as shown in FIG. 3. The third power voltage supply line may be directly coupled to the third auxiliary electrode AE3.

The first auxiliary electrode AE1 may be formed between the second auxiliary electrode AE2 and the fourth auxiliary electrode AE4. The second auxiliary electrode AE2 may be formed between the first auxiliary electrode AE1 and the active area A/A. The fourth auxiliary electrode AE4 may be formed between the display drive circuit 120 and the first auxiliary electrode AE1. The first auxiliary electrode AE1, the second auxiliary electrode AE2, and the fourth auxiliary electrode AE4 may be parallel to the scan lines. The third auxiliary electrode AE3 may surround the active area A/A except for a side adjacent to the second auxiliary electrode AE2. The first link electrode CE1 may be overlapped with the first auxiliary electrode AE1 as shown in FIG. 3. Also, the first link electrode CE1 may be made of a metal pattern different from the first auxiliary electrode AE1. Also, the width of the first link electrode CE1 may be wider than the width of the first auxiliary electrode AE1 in a direction of the data lines (e.g., y-axis direction).

Figure 4:
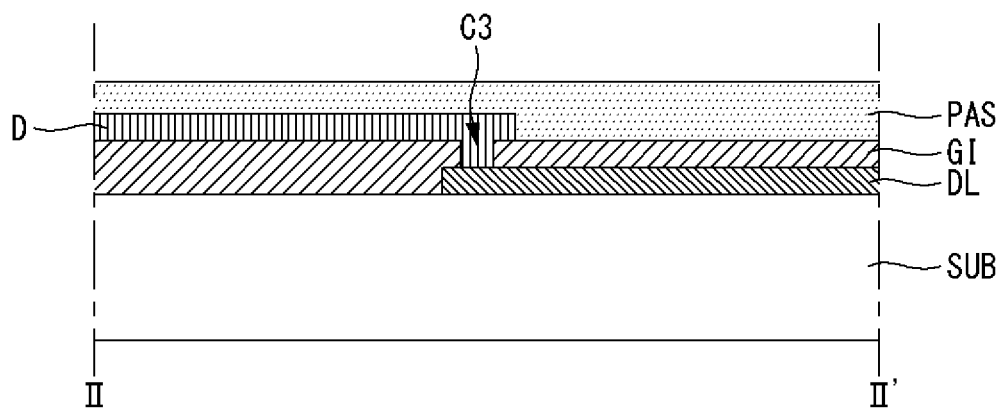
FIG. 4 is a cross-sectional diagram of II-II' in FIG. 2.

Each of the data links DL may be coupled to the display drive circuit 120 and each of the data lines D. For example, one end of the data link DL may be coupled to the display drive circuit 120 and the other end thereof may be coupled to the data line D through a third contact hole C3 as shown in FIG. 4. The data link DL may be formed obliquely against the data line D from the one end to a predetermined point and may be formed parallel to the data line D from the predetermined point to the other end.

Figure 5:
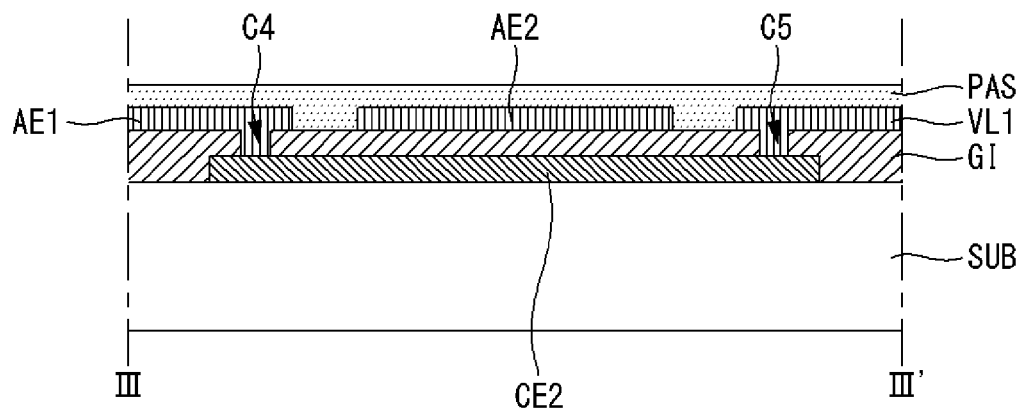
FIG. 5 is a cross-sectional diagram of III-III' in FIG. 2.
Figure 6:
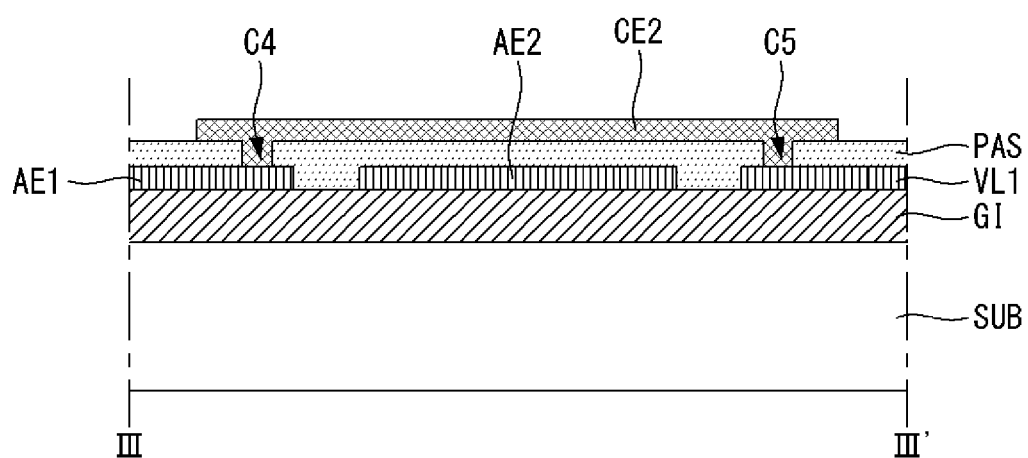
FIG. 6 is another cross-sectional diagram of III-III' in FIG. 2.
Figure 7:
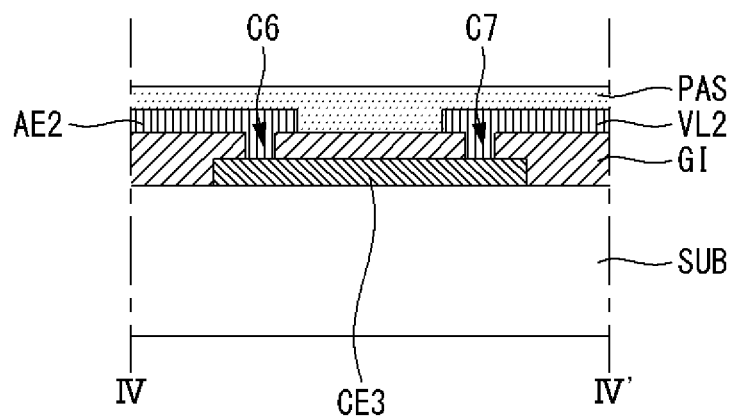
FIG. 7 is a cross-sectional diagram of IV-IV' in FIG. 2.
Figure 8:
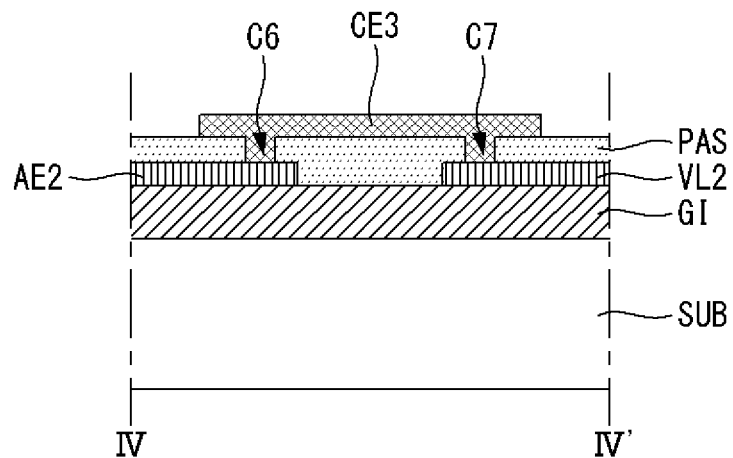
FIG. 8 is another cross-sectional diagram of IV-IV' in FIG. 2.

The first auxiliary electrode AE1 may be coupled to each of the first voltage lines VL1 through a second link electrode CE2. For example, the first auxiliary electrode AE1 may be coupled to the second link electrode CE2 through a fourth contact hole C4 and the first voltage lines VL1 may be coupled to the second link electrode CE2 through a fifth contact hole C5 as shown in FIG. 5 or 6. The second auxiliary electrode AE2 may be coupled to each of the second voltage lines VL2 through a third link electrode CE3. For example, the second auxiliary electrode AE2 may be coupled to the third link electrode CE3 through a sixth contact hole C6, and the second voltage lines VL2 may be coupled to the third link electrode CE3 through a seventh contact hole C7 as shown in FIG. 7 or 8. The first and second voltage lines VL1, VL2 may be parallel to the data lines.

Meanwhile, the data links and the scan lines may be made of a first metal pattern; the first to fourth auxiliary electrode AE1, AE2, AE3, AE4, the data lines D, and the first to third power voltage supply line PSL1, PSL2, PSL3 may be made of a second metal pattern; and the first link electrode CE1 may be formed on a third metal pattern. The second and third link electrodes CE2, CE3 may be made of the first metal pattern or the third metal pattern. In some embodiments, the first metal pattern may be a gate metal pattern, the second metal pattern may be a source/drain metal pattern, and the third metal pattern may be a transparent electrode, such as ITO and IZO or a reflective electrode.

FIG. 3 is a cross-sectional diagram of I-I' in FIG. 2. A connection structure of the second power voltage supply line PSL2 and the second auxiliary electrode AE2 using the first link electrode CE1 is described with reference to FIG. 3.

With reference to FIG. 3, the data links DL may be made of the first metal pattern on a lower substrate SUB. A gate insulator GI may be formed on the first metal pattern such as the data links DL. The second power supply voltage line PSL2, the first auxiliary electrode AE1, and the second auxiliary electrode AE2 may be made of the second metal pattern on the gate insulator GI. A passivation layer PAS may be formed on the second metal pattern such as the second power supply voltage line PSL2, the first auxiliary electrode AE1, and the second auxiliary electrode AE2. The passivation layer PAS may include one or more layers. A first contact hole C1 exposing the second power supply voltage line PSL2 by penetrating the passivation layer PAS may be formed. A second contact hole C2 exposing the second auxiliary electrode AE2 by penetrating the passivation layer PAS may be formed. The first link electrode CE1 may be made of the third metal pattern on the passivation layer PAS. The first link electrode CE1 may be coupled to the second power supply voltage line PSL2 through the first contact hole C1. The second auxiliary electrode AE2 may be coupled to the second power supply voltage line PSL2 through the second contact hole C2.

The first link electrode CE1 may be overlapped with the first auxiliary electrode AE1. Also, the width of the first link electrode CE1 may be wider than the width of the first auxiliary electrode AE1 in a direction of the data lines D (e.g., the y-axis direction of FIG. 2). Also, other passivation layers and metal patterns formed on the third metal pattern are omitted for convenience of the description in FIG. 3, as they should be understood to one of ordinary skill in the art.

Meanwhile, in the related art, the data links DL and the first link electrode CE1 are made of a same metal pattern such as the first metal pattern. Hence, it is difficult, in the related art, to design the first link electrode CE1 for avoiding the data links DL on an area A1 because a gap between the data links DL is narrow in the related art. The "area A1" refers to an area on which the data links DL are formed obliquely against the data lines D. Therefore, in the related art, nothing is formed on the area A1.

However, in some embodiments of the present invention, data links DL may be made of the first metal pattern, and the first link electrode CE1 may be made of the third metal pattern. Hence, the first link electrode CE1 may not interfere in the data links DL on the area A1. That is, as described in FIGS. 2 and 3, the first auxiliary electrode AE1 may be formed on the area A1, thus a gap between the display drive circuit 120 and the first auxiliary electrode AE1 may be decreased as compared to the related art. As a result, embodiments may decrease the width of the upper bezel area UBZ, and make the display device slim and improve design and appearance of the display device.

FIG. 4 is a cross-sectional diagram of II-II' in FIG. 2. A connection structure of the data links DL and the data lines D is described with reference to FIG. 4.

With reference to FIG. 4, the data links DL may be made of the first metal pattern on a lower substrate SUB. A gate insulator GI may be formed on the first metal pattern such as the data links DL. A third contact hole C3 exposing the data link DL by penetrating the gate insulator GI may be formed.

The data line D may be made of the second metal pattern on the gate insulator GI. The data line D may be coupled to the data link DL through the third contact hole C3. A passivation layer PAS may be formed on the second metal pattern such as the data line D. The passivation layer PAS may include one or more layers. Meanwhile, other passivation layers and metal patterns formed on the passivation layer PAS are omitted for convenience of the description in FIG. 4, as they should be understood by one of ordinary skill in the art.

FIG. 5 is a cross-sectional diagram of III-III' in FIG. 2. A connection structure of the first auxiliary electrode AE1 and the first voltage line VL1 through the second link electrode CE2 is described with reference to FIG. 5.

With reference to FIG. 5, the second link electrode CE2 may be made of the first metal pattern on a lower substrate SUB. A gate insulator GI may be formed on the first metal pattern such as the second link electrode CE2. A fourth contact hole C4 exposing the second link electrode CE2 by penetrating the gate insulator GI may be formed. A fifth contact hole C5 exposing the second link electrode CE2 by penetrating the gate insulator GI may be formed. The first auxiliary electrode AE1, the second auxiliary electrode AE2, and the first voltage lines VL1 may be made of the second metal pattern on the gate insulator GI. The first auxiliary electrode AE1 may be coupled to the second link electrode CE2 through the fourth contact hole C4. The first voltage line VL1 may be coupled to the second link electrode CE2 through the fifth contact hole C5. The second auxiliary electrode AE2 may be formed between the first auxiliary electrode AE and the first voltage line VL1. A passivation layer PAS may be formed on the second metal pattern such as the first auxiliary electrode AE1, the second auxiliary electrode AE2, and the first voltage lines VL1. The passivation layer PAS may include at least one or more layer. Meanwhile, other passivation layers and metal patterns formed on the passivation layer PAS are omitted for convenience of the description in FIG. 5, as they should be understood by one of ordinary skill in the art.

FIG. 6 is another cross-sectional diagram of III-III' in FIG. 2. Another connection structure of the first auxiliary electrode AE1 and the first voltage line VL1 through the second link electrode CE2 is described with reference to FIG. 6.

With reference to FIG. 6, a gate insulator GI may be formed on a lower substrate SUB. The first auxiliary electrode AE1, the second auxiliary electrode AE2, and the first voltage lines VL1 may be made of the second metal pattern on the gate insulator GI. The second auxiliary electrode AE2 may be formed between the first auxiliary electrode AE and the first voltage line VL1. A passivation layer PAS may be formed on the second metal pattern such as the first auxiliary electrode AE1, the second auxiliary electrode AE2, and the first voltage lines VL1. The passivation layer PAS may include at least one or more layer. A fourth contact hole C4 exposing the first auxiliary electrode AE1 by penetrating the passivation layer PAS may be formed. A fifth contact hole C5 exposing the first voltage line VL1 by penetrating the passivation layer PAS may be formed. The second link electrode CE2 may be made of the third metal pattern on the passivation layer PAS. The second link electrode CE2 may be coupled to the first auxiliary electrode AE1 through the fourth contact hole C4. The first voltage line VL1 may be coupled to the first auxiliary electrode AE1 through the fifth contact hole C5. Meanwhile, other passivation layers and metal patterns formed on the third metal pattern are omitted for convenience of the description in FIG. 6, as they should be understood by one of ordinary skill in the art.

FIG. 7 is a cross-sectional diagram of IV-IV' in FIG. 2. A connection structure of the second auxiliary electrode AE2 and the second voltage line VL2 through the third link electrode CE3 is described with reference to FIG. 7.

With reference to FIG. 7, the third link electrode CE3 may be made of the first metal pattern on a lower substrate SUB. A gate insulator GI may be formed on the first metal pattern such as the third link electrode CE3. A sixth contact hole C6 exposing the third link electrode CE3 by penetrating the gate insulator GI may be formed. A seventh contact hole C7 exposing the third link electrode CE3 by penetrating the gate insulator GI may be formed. The second auxiliary electrode AE2 and the second voltage lines VL2 may be made of the second metal pattern on the gate insulator GI. The second auxiliary electrode AE2 may be coupled to the third link electrode CE3 through the sixth contact hole C6. The second voltage line VL2 may be coupled to the third link electrode CE3 through the seventh contact hole C7. A passivation layer PAS may be formed on the second metal pattern such as the second auxiliary electrode AE2 and the second voltage lines VL2. The passivation layer PAS may include at least one or more layer. Meanwhile, other passivation layers and metal patterns formed on the passivation layer PAS are omitted for convenience of the description in FIG. 7, as they should be understood by one of ordinary skill in the art.

FIG. 8 is another cross-sectional diagram of IV-IV' in FIG. 2. Another connection structure of the second auxiliary electrode AE2 and the second voltage line VL2 through the third link electrode CE3 is described with reference to FIG. 8.

With reference to FIG. 8, a gate insulator GI may be formed on a lower substrate SUB. The second auxiliary electrode AE2 and the second voltage lines VL2 may be made of the second metal pattern on the gate insulator GI. A passivation layer PAS may be formed on the second metal pattern such as the second auxiliary electrode AE2 and the second voltage lines VL2. The passivation layer PAS may include at least one or more layer. A sixth contact hole C6 exposing the second auxiliary electrode AE2 by penetrating the passivation layer PAS may be formed. A seventh contact hole C7 exposing the second voltage line VL2 by penetrating the passivation layer PAS may be formed. The third link electrode CE3 may be made of the third metal pattern on the passivation layer PAS. The third link electrode CE3 may be coupled to the second auxiliary electrode AE2 through the sixth contact hole C6. The second voltage line VL2 may be coupled to the second auxiliary electrode AE2 through the seventh contact hole C7. Meanwhile, other passivation layers and metal patterns formed on the third metal pattern are omitted for convenience of the description in FIG. 8, as they should be understood by one of ordinary skill in the art.

FIG. 9 is an expanded plan including a fourth link electrode in the expanded plan of FIG. 2. The first to third power voltage supply lines PSL1, PSL2, PSL3; the first to fourth auxiliary electrodes AE1, AE2, AE3, AE4; the first to third link electrodes CE1, CE2, CE3; the data links DL, the data lines D; the first and second voltage lines VL1, VL2; and the display drive circuit 120 in FIG. 9 are substantially same as described in FIG. 2. Therefore, the detailed description of the first to third power voltage supply lines PSL1, PSL2, PSL3; the first to fourth auxiliary electrodes AE1, AE2, AE3, AE4; the first to third link electrodes CE1, CE2, CE3; the data links DL; the data lines D; the first and second voltage lines VL1, VL2; and the display drive circuit 120 in FIG. 9 is omitted for convenience.

Figure 10:
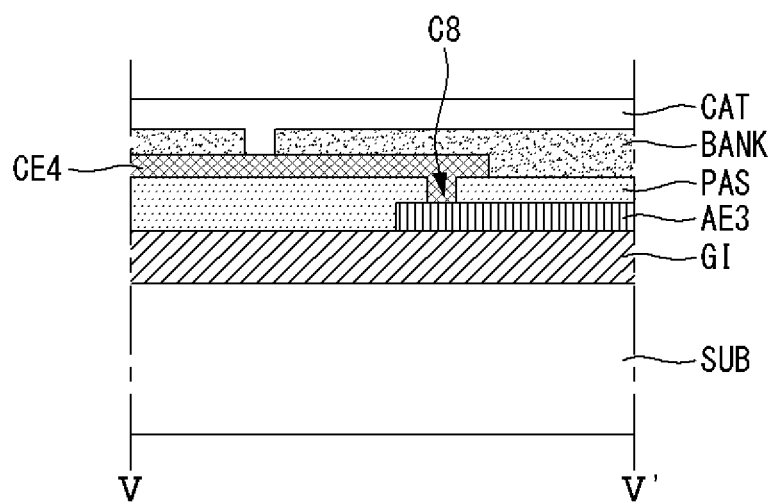
FIG. 10 is a cross-sectional diagram of V-V' in FIG. 9.

With reference to FIG. 9, the second and the third link electrodes CE2, CE3 may be made of the first metal pattern. The fourth link electrode CE4 may be made of the third metal pattern. The fourth link electrode CE4 may be coupled to the third auxiliary electrode CE3 and the fourth auxiliary electrode CE4. For example, the fourth electrode CE4 may be coupled to the third auxiliary electrode AE3 through an eighth contact hole C8 as shown in FIG. 10. The fourth auxiliary electrode AE4 may be coupled to the third auxiliary electrode AE3 through a ninth contact hole C9 as shown in FIG. 10. Also, the fourth link electrode CE4 may be coupled to a cathode electrode formed on a bank layer. The bank layer may be formed on the fourth electrode CE4. The cathode electrode may be formed on a whole area of the display panel DIS. Therefore, the third power voltage of the third power voltage supply line PSL3 may be supplied to the third auxiliary electrode AE3, to the fourth auxiliary electrode AE4, and to the cathode electrode.

Meanwhile, the first link electrode CE1 and the fourth link electrode CE4 may be made of a same metal pattern such as the third metal pattern. Thus, the fourth link electrode CE4 may be formed by avoiding the first link electrode CE1 because the fourth link electrode CE4 may not be overlapped with the first link electrode CE1. In FIG. 9, other passivation layers and metal patterns formed on the third metal pattern are omitted for convenience of the description, as they should be understood by one of ordinary skill in the art.

FIG. 10 is a cross-sectional diagram of V-V' in FIG. 9. A connection structure of the third auxiliary electrode AE3 and the cathode electrode CAT through the fourth link electrode CE4 is described with reference to FIG. 10.

With reference to FIG. 10, a gate insulator GI may be formed on a lower substrate SUB. The third auxiliary electrode AE3 may be made of the second metal pattern on the gate insulator GI. A passivation layer PAS may be formed on the second metal pattern such as the second auxiliary electrode AE3. The passivation layer PAS may include at least one or more layer. A eighth contact hole C8 exposing the third auxiliary electrode AE3 by penetrating the passivation layer PAS may be formed. The fourth link electrode CE4 may be made of the third metal pattern on the passivation layer PAS. The fourth link electrode CE4 may be coupled to the third auxiliary electrode AE3 through the eighth contact hole C8. A bank layer BANK may be formed on the third metal pattern such as the fourth link electrode CE4. A contact hole exposing the fourth link electrode CE4 by penetrating the bank layer BANK may be formed. The cathode electrode CAT may be formed on the bank layer BANK. The cathode electrode CAT may be coupled to the fourth link electrode CE4 through the contact hole.

Meanwhile, a cross-sectional diagram of VI-VI' in FIG. 9 is substantially same as the cross-sectional diagram of V-V' shown in FIG. 10. Therefore, the detailed description of the cross-sectional diagram of VI-VI' in FIG. 9 is omitted for convenience.

FIG. 11 is another expanded plan including a fourth link electrode in the expanded plan of FIG. 2. The first to third power voltage supply lines PSL1, PSL2, PSL3; the first to fourth auxiliary electrodes AE1, AE2, AE3, AE4; the first to third link electrodes CE1, CE2, CE3; the data links DL; the data lines D; the first and second voltage lines VL1, VL2; and the display drive circuit 120 in FIG. 11 are substantially the same as described in FIG. 2. Therefore, the detailed description of the first to third power voltage supply lines PSL1, PSL2, PSL3; the first to fourth auxiliary electrodes AE1, AE2, AE3, AE4; the first to third link electrodes CE1, CE2, CE3; the data links DL; the data lines D; the first and second voltage lines VL1, VL2; and the display drive circuit 120 in FIG. 11 is omitted for convenience.

With reference to FIG. 11, the second and the third link electrodes CE2, CE3 may be made of the third metal pattern. The fourth link electrode CE4 may be made of the third metal pattern. The fourth link electrode CE4 may be coupled to the third auxiliary electrode CE3 and the fourth auxiliary electrode CE4. For example, the fourth electrode CE4 may be coupled to the third auxiliary electrode AE3 through an eighth contact hole C8 as shown in FIG. 10. The fourth auxiliary electrode AE4 may be coupled to the third auxiliary electrode AE3 through a ninth contact hole C9 as shown in FIG. 10. Also, the fourth link electrode CE4 may be coupled to a cathode electrode formed on a bank layer. The bank layer may be formed on the fourth electrode CE4. The cathode electrode may be formed on a whole area of the display panel DIS. Therefore, the third power voltage of the third power voltage supply line PSL3 may be supplied to the third auxiliary electrode AE3, the fourth auxiliary electrode AE4, and the cathode electrode.

Meanwhile, the first to fourth link electrodes CE1, CE2, CE3, CE4 may be made of a same metal pattern such as the third metal pattern. Thus, the fourth link electrode CE4 may be formed by avoiding the first to third link electrodes CE1, CE2, CE3 because the fourth link electrode CE4 may not be overlapped with the first to third link electrodes CE1, CE2, CE3. In FIG. 11, other passivation layers and metal patterns formed on the third metal pattern are omitted for convenience of description, as they should be understood by one of ordinary skill in the art.

In the embodiments described herein, the first link electrode CE1 connecting the power voltage supply line PSL2 to the second auxiliary electrode AE2 may be made of a metal pattern different from the data links DL. Therefore, in some embodiments, the first link electrode CE1 may not interfere in the data links DL on the area A1 on which the data links DL may be formed on obliquely against the data lines. Accordingly, in some embodiments, a gap between the display drive circuit 120 and the first auxiliary electrode AE1 may be decreased as compared with the related art. As a result, embodiments may decrease the width of the upper bezel area UBZ, and may make the display device more slim and improve design and appearance of the display device.

It will be apparent to those skilled in the art that various modifications and variations can be made in embodiments of the present invention without departing from the spirit or scope of the invention. Thus, it is intended that the present invention cover the modifications and variations of this invention provided they come within the scope of the appended claims and their equivalents.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A display device, comprising:
a first auxiliary electrode coupled to a first power voltage supply line configured to supply a first power voltage;
a second auxiliary electrode coupled to a second power voltage supply line configured to supply a second power voltage through a first link electrode;
an active area, comprising:
scan lines;
data lines crossing over the scan lines;
first voltage lines coupled to the first auxiliary electrode;
second voltage lines coupled to the second auxiliary electrode; and
a plurality of pixels arranged in a matrix form; and
a display drive circuit configured to supply data voltages to data links coupled to the data lines,
wherein the first auxiliary electrode, the second auxiliary electrode, the first power voltage supply line, the second power voltage supply line, the data links, and the display drive circuit are in a bezel area corresponding to an area outside the active area,
wherein the second auxiliary electrode is between the first auxiliary electrode and the active area,
wherein the first auxiliary electrode is between the second auxiliary electrode and the display drive circuit,
wherein the first link electrode is disposed at least partially over the first auxiliary electrode without touching the first auxiliary electrode, and
wherein the first auxiliary electrode and the second auxiliary electrode are disposed at least partially over at least one of the data links without touching the at least one of the data links.

2. The display device of claim 1, wherein the first auxiliary electrode is on a first area on which the data links are obliquely against the data lines.

3. The display device of claim 1, wherein:
the first auxiliary electrode overlaps the first link electrode; and
the width of the first link electrode is wider than the width of the first auxiliary electrode in a direction of the data lines.

4. The display device of claim 1, wherein:
each of the first auxiliary electrode and the second auxiliary electrode is parallel to the scan lines; and
each of the first voltage lines and the second voltage lines is parallel to the data lines.

5. The display device of claim 1, wherein:
each of the first voltage lines is coupled to the first auxiliary electrode through a second link electrode; and
each of the second voltage lines is coupled to the second auxiliary electrode through a third link electrode.

6. The display device of claim 5, further comprising:
a third auxiliary electrode coupled to a third power voltage supply line configured to supply a third power voltage and in the bezel area,
wherein the third auxiliary electrode surrounds the active area except for a side adjacent to the second auxiliary electrode.

7. The display device of claim 6, further comprising:
a fourth auxiliary electrode coupled to the third auxiliary electrode through a fourth link electrode and in the bezel area,
wherein the fourth auxiliary electrode is between the first auxiliary electrode and the display drive circuit.

8. The display device of claim 7, wherein the fourth link electrode connects the third auxiliary electrode and the fourth auxiliary electrode to a cathode electrode.

9. The display device of claim 7, wherein the fourth auxiliary electrode is parallel to the scan lines.

10. The display device of claim 7, wherein:
the data links, the second link electrode, the third link electrode, and the scan lines comprise a first metal pattern;
the first auxiliary electrode, the second auxiliary electrode, and the third auxiliary electrode, the fourth auxiliary electrode, the data lines, the first power voltage supply line, the second power voltage supply line, and the third power voltage supply line comprise a second metal pattern; and the first link electrode and the fourth link electrode comprise a third metal pattern.

11. The display device of claim 7, wherein:

the data links and the scan lines comprise a first metal pattern;

the first auxiliary electrode, the second auxiliary electrode, the third auxiliary electrode, the fourth auxiliary electrode, the data lines, the first power voltage supply line, the second power voltage supply line, and the third power voltage supply line comprise a second metal pattern; and the first link electrode, the second link electrode, the third link electrode, and the fourth link electrode comprise a third metal pattern.

12. A method of forming a display device, the method comprising:

forming a first auxiliary electrode coupled to a first power voltage supply line configured to supply a first power voltage;

forming a second auxiliary electrode coupled to a second power voltage supply line configured to supply a second power voltage through a first link electrode;

forming an active area, comprising:
scan lines;
data lines crossing over the scan lines;
first voltage lines coupled to the first auxiliary electrode;
second voltage lines coupled to the second auxiliary electrode; and
a plurality of pixels arranged in a matrix form;

forming a display drive circuit configured to supply data voltages to data links coupled to the data lines;

forming the first auxiliary electrode, the second auxiliary electrode, the first power voltage supply line, the second power voltage supply line, the data links, and the display drive circuit in a bezel area corresponding to an area outside the active area;

forming the second auxiliary electrode between the first auxiliary electrode and the active area; and forming the first auxiliary electrode between the second auxiliary electrode and the display drive circuit, wherein the first link electrode is formed at least partially over the first auxiliary electrode without touching the first auxiliary electrode, and wherein the first auxiliary electrode and the second auxiliary electrode are formed at least partially over at least one of the data links without touching the at least one of the data links.

13. The method of claim 12, further comprising forming the first auxiliary electrode on a first area on which the data links are formed obliquely against the data lines.

14. The method of claim 12, wherein:
the first auxiliary electrode overlaps the first link electrode; and the width of the first link electrode is wider than the width of the first auxiliary electrode in a direction of the data lines.

15. The method of claim 12, wherein:
each of the first auxiliary electrode and the second auxiliary electrode is parallel to the scan lines; and
each of the first voltage lines and the second voltage lines is parallel to the data lines.

16. The method of claim 12, wherein:
each of the first voltage lines is coupled to the first auxiliary electrode through a second link electrode; and
each of the second voltage lines is coupled to the second auxiliary electrode through a third link electrode.

17. The method of claim 16, further comprising:
forming a third auxiliary electrode coupled to a third power voltage supply line configured to supply a third power voltage and formed in the bezel area,
wherein the third auxiliary electrode surrounds the active area except for a side adjacent to the second auxiliary electrode.

18. The method of claim 17, further comprising:
forming a fourth auxiliary electrode coupled to the third auxiliary electrode through a fourth link electrode and formed in the bezel area,
wherein the fourth auxiliary electrode is formed between the first auxiliary electrode and the display drive circuit.

19. The method of claim 18, wherein the fourth link electrode connects the third auxiliary electrode and the fourth auxiliary electrode to a cathode electrode.

20. The method of claim 18, wherein the fourth auxiliary electrode is parallel to the scan lines.

21. The method of claim 18, wherein:
the data links, the second link electrode, the third link electrode, and the scan lines comprise a first metal pattern;
the first auxiliary electrode, the second auxiliary electrode, and the third auxiliary electrode, the fourth auxiliary electrode, the data lines, the first power voltage supply line, the second power voltage supply line, and the third power voltage supply line comprise a second metal pattern; and
the first link electrode and the fourth link electrode comprise a third metal pattern.

22. The method of claim 18, wherein:
the data links and the scan lines comprise a first metal pattern;
the first auxiliary electrode, the second auxiliary electrode, the third auxiliary electrode, the fourth auxiliary electrode, the data lines, the first power voltage supply line, the second power voltage supply line, and the third power voltage supply line comprise a second metal pattern; and
the first link electrode, the second link electrode, the third link electrode, and the fourth link electrode comprise a third metal pattern.

* * * * *